US008155353B2

(12) United States Patent
Kushida et al.

(10) Patent No.: US 8,155,353 B2
(45) Date of Patent: Apr. 10, 2012

(54) DEVICE AND METHOD FOR DRIVING SPEAKER

(75) Inventors: Hideaki Kushida, Saitama (JP); Hiroshi Saito, Saitama (JP)

(73) Assignee: Sony Corporation, Tokyo (JP)

( * ) Notice: Subject to any disclaimer, the term of this patent is extended or adjusted under 35 U.S.C. 154(b) by 1199 days.

(21) Appl. No.: 11/194,679

(22) Filed: Aug. 2, 2005

(65) Prior Publication Data

US 2006/0029238 A1 Feb. 9, 2006

(30) Foreign Application Priority Data

Aug. 4, 2004 (JP) ................................ P2004-228272

(51) Int. Cl.
*H03F 99/00* (2009.01)
*H04R 3/00* (2006.01)

(52) U.S. Cl. ........................... 381/121; 381/120; 381/96

(58) Field of Classification Search .................... 381/56, 381/77, 96, 111, 116, 117, 393, 120, 121, 381/58–59
See application file for complete search history.

(56) References Cited

U.S. PATENT DOCUMENTS 3,889,060 A * 6/1975 Goto et al. ...................... 381/96

FOREIGN PATENT DOCUMENTS

| | | |
|---|---|---|
| JP | 53-48087 | 5/1978 |
| JP | 53-105216 | 9/1978 |
| JP | 62-120195 | 6/1987 |
| JP | 05-344596 | 12/1993 |
| JP | 06-062487 | 3/1994 |
| JP | 06-086382 | 3/1994 |
| JP | 10-164689 | 6/1998 |
| JP | 10-224884 | 8/1998 |
| JP | 2000-270394 | 9/2000 |
| JP | 2000-295688 | 10/2000 |

* cited by examiner

*Primary Examiner* — Devona Faulk
*Assistant Examiner* — George Monikang
(74) *Attorney, Agent, or Firm* — Finnegan, Henderson, Farabow, Garrett & Dunner, L.L.P.

(57) ABSTRACT

Distortion caused in the voltage of an audio signal due to a back electromotive force generated due to loads in a speaker is detected, the detected distorted voltage is eliminated from the voltage of the audio signal, and the audio signal without the distorted voltage is amplified and given to the speaker.

3 Claims, 4 Drawing Sheets

DEVICE AND METHOD FOR DRIVING SPEAKER

CROSS REFERENCE TO RELATED APPLICATIONS

The present invention contains subject matter related to Japanese Patent Application JP2004-228272 filed in the Japanese Patent Office on Aug. 4, 2004, the entire contents of which being incorporated herein by reference.

BACKGROUND OF THE INVENTION

1. Field of the Invention

This invention relates to a device and method for driving a speaker and is suitably applied to a speaker unit having a signal amplifier.

2. Description of the Related Art

Referring to FIG. 1, a speaker unit 1 of one type amplifies with a signal amplifier 3 an audio signal S1 reproduced by a signal source 2, and outputs sounds based on the obtained audio signal S2 from a speaker 4, the signal source 2 being an external reproduction device such as a Mini Disc (MD) player or a tuner.

For example, as shown in FIG. 2, the cone speaker 4 has a cone diaphragm 10 with both ends open. The outer opening of the cone diaphragm 10 is supported by an edge 12 formed in a frame 11 via a gasket 13, and its inner opening is supported by a damper 14 attached to the frame 11, so that the cone diaphragm 10 can vibrate forward and backward with respect to the frame 11.

Fixed to the inner opening of the cone diaphragm 10 is a cylinder voice coil bobbin 16 having a voice coil 15 being a lead wire wounded therearound. In addition, a hemisphere head cap 17 is attached so as to cover the inner opening of the cone diaphragm 10.

Attached to the bottom of the frame 11 is a magnetic circuit 18 for vibrating the cone diaphragm 10 forward and backward. This magnetic circuit 18 has a disc yoke 19 with a column pole piece 19A formed at the center, a ring magnet 20, and a ring plate 21, which are fixed to each other.

While the magnetic circuit 18 is attached to the bottom of the frame 11, the voice coil bobbin 16 having the voice coil 15 wounded therearound is kept out of touch in a gap g between the pole piece 19A and the plate 21.

In addition, in this speaker 4, a connector 22 having a plurality of connecting terminals is provided at a projecting part 11P formed at the bottom of the frame 11, so that reproduction devices (that is, the signal source 2 of FIG. 1) such as an external MD and a tuner can be connected to the connecting terminals with lines via the signal amplifier 3 (FIG. 1). A harness is drawn from each connecting terminal of the connector 22 and is conductive to the lead wire 15A of the voice coil 15.

When the speaker 4 receives the audio signal S2 from the signal amplifier 3, a magnetic field according to an impressed current based on the audio signal S2 is generated in the magnetic gap g between the pole piece 19A and the plate 21 of the magnetic circuit 18. Therefore, sound waves based on the audio signal S2 is generated while the cone diaphragm 10 vibrates forward and backward because of attraction and repulsion of the voice coil 15 existing in the magnetic gap g (For example, refer to Japanese Patent Application Laid-open No. 53-48087).

SUMMARY OF THE INVENTION

In the speaker unit 1 shown in FIG. 1, when a signal current according to the audio signal S2 coming from the signal source 2 via the signal amplifier 3 flows into the magnetic circuit 18 (FIG. 2) of the speaker 4, a secondary current according to the signal current is induced by magnetic coupling and a driving force according to the signal current is supplied to the voice coil 15 under the Fleming's left-hand rule.

At this time, a back electromotive force is generated in the voice coil 15 (FIG. 2) due to the vibration of the cone diaphragm 10, which may make a current according to the back electromotive force flow into the signal amplifier 3 (FIG. 1). In this case, the signal amplifier 3 may cause a voltage distortion in the amplified audio signal S2 due to the current coming from the voice coil 15 of the speaker 4, which results in deterioration in sound quality of sounds based on the audio signal S2.

Especially, sudden change in the amplification or frequency of the voltage of the audio signal S2 has a tendency to cause a large voltage distortion in the audio signal S2.

This invention has been made in view of foregoing and intends to propose a device and method for driving a speaker while effectively preventing sounds based on an audio signal from having noises.

According to one embodiment of this invention, there has been provided a device for driving a speaker by amplifying an input audio signal via a first amplification circuit and giving the voltage of the obtained audio signal to the speaker. This speaker driving device is provided with a distortion detector for detecting distortion which is caused in the voltage of an audio signal due to a back electromotive force generated by loads of the speaker, and a distortion eliminator for eliminating the distorted voltage detected by the distortion detector, from the voltage of the audio signal, and is designed so as to supply the audio signal output from the distortion eliminator, to the speaker after performing amplification via the first amplification circuit.

As a result, the speaker driving device can previously prevent the audio signal from having distortion, without influences of the back electromotive force generated due to the loads of the speaker, on the audio signal amplified by the first amplification circuit. This means that the speaker driving device is capable of effectively preventing sounds based on an audio signal from having noise.

Further, according to one embodiment of this invention, there has been provided a speaker driving method for driving a speaker by amplifying an input audio signal and then supplying the voltage of the obtained audio signal to the speaker. In this speaker driving method, distortion which is caused in the voltage of the audio signal due to a back electromotive force generated by loads of the speaker is detected, the detected distorted voltage is eliminated from the voltage of the audio signal, and the audio signal without the distorted voltage is amplified and supplied to the speaker.

As a result, according to the speaker driving method, the audio signal can be previously prevented from having distortion without influences of the back electromotive force generated by the loads of the speaker on the amplified audio signal. This means that the speaker driving method is capable of effectively preventing sounds based on an audio signal from having noise.

The nature, principle and utility of the invention will become more apparent from the following detailed description when read in conjunction with the accompanying drawings in which like parts are designated by like reference numerals or characters.

DETAILED DESCRIPTION OF THE EMBODIMENT

Figure 1:
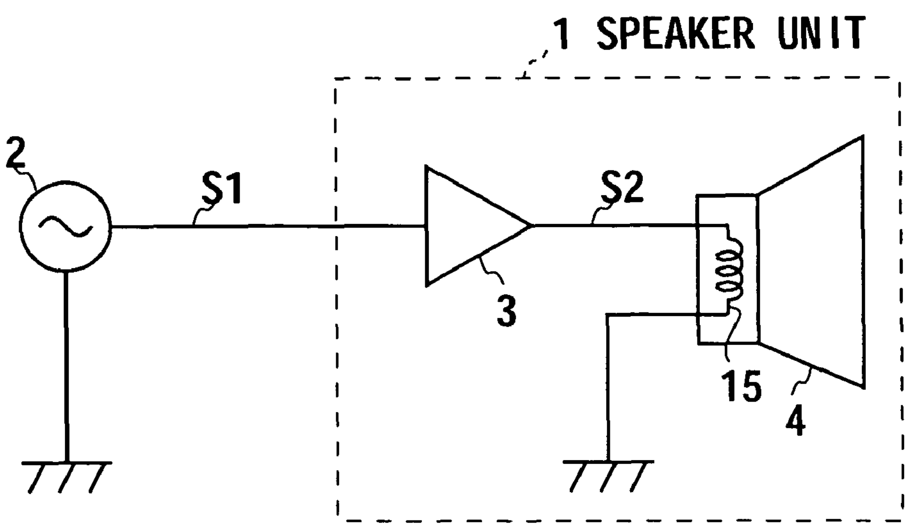
FIG. 1 (RELATED ART)
FIG. 1 is a block diagram of a speaker unit in related art.
Figure 2:
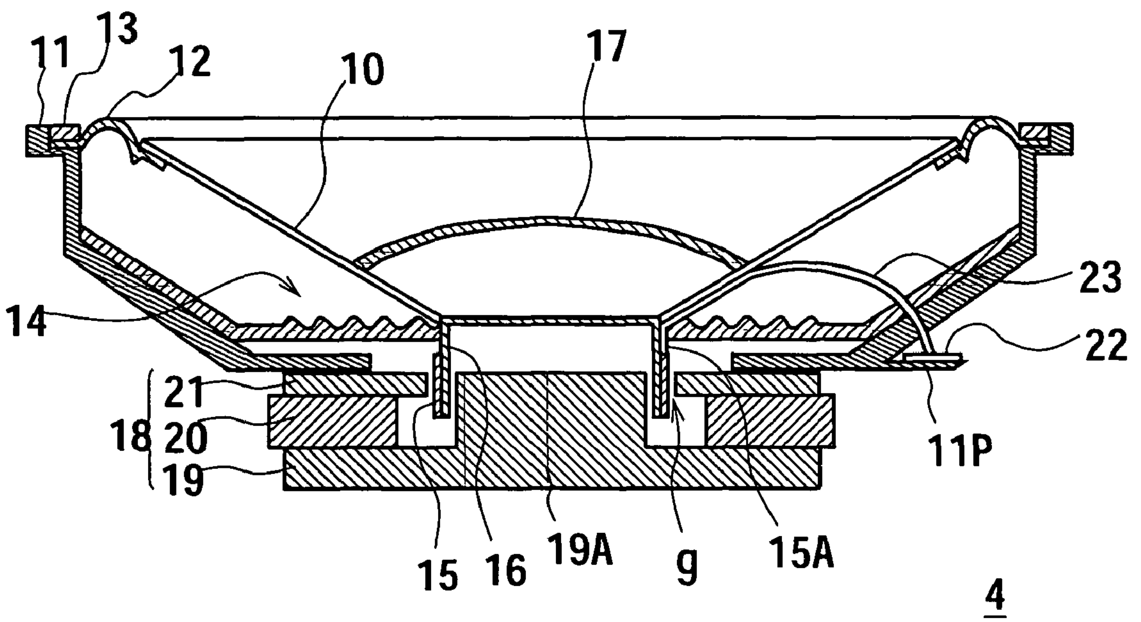
FIG. 2 (RELATED ART)
FIG. 2 is a schematic sectional view of the internal configuration of the speaker unit in related art.
Figure 3:
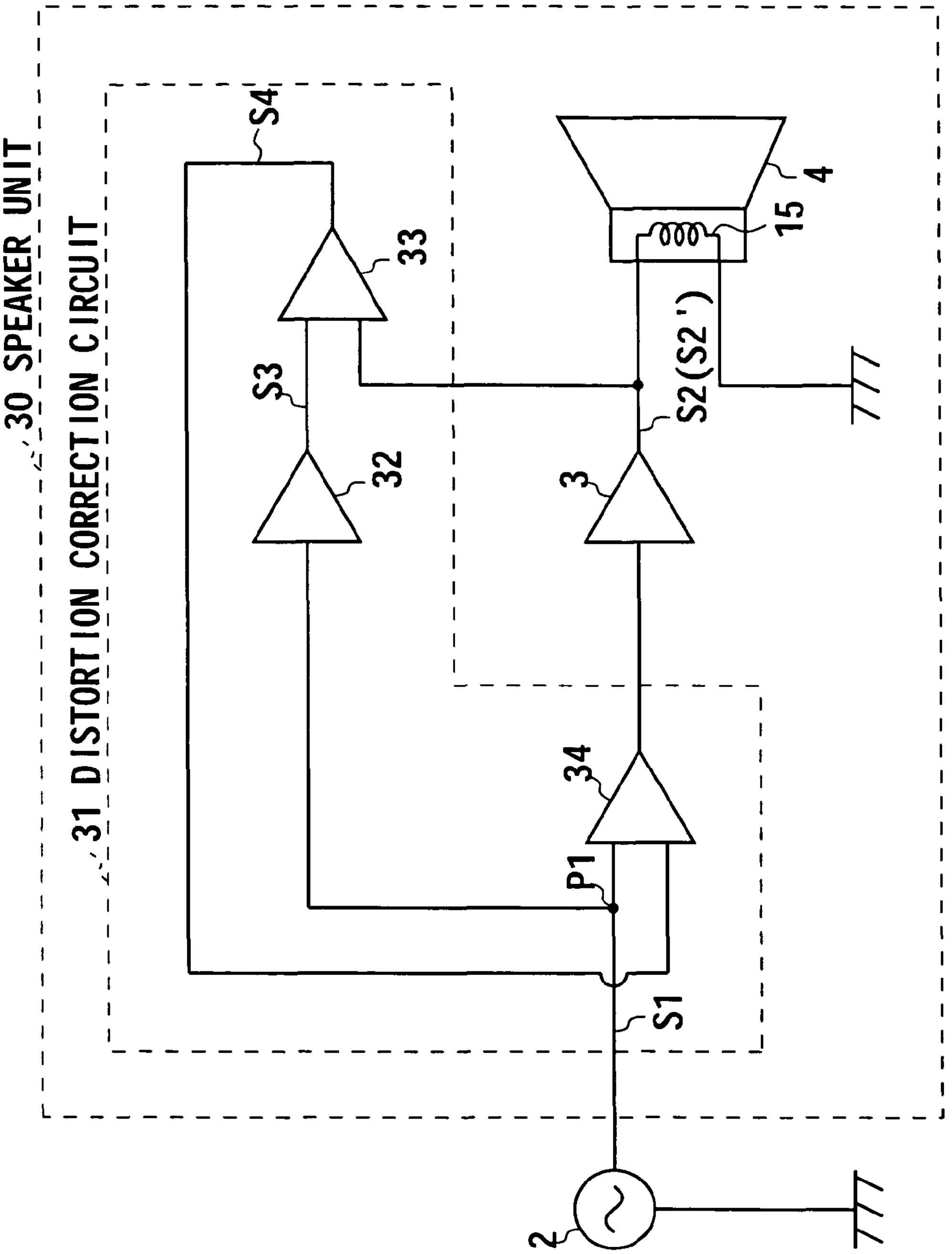
FIG. 3 is a block diagram of a speaker unit according to one embodiment of the present invention.

Preferred embodiments of this invention will be described with reference to the accompanying drawings:

In FIG. 3 where the same reference numerals are applied to parts corresponding to those of FIG. 1, reference numeral 30 shows a speaker unit according to one embodiment. This speaker unit 30 is identical to the aforementioned speaker unit 1, expect that a distortion correction circuit 31 for correcting an output voltage of a signal amplifier 3 with feedback control is provided between a signal source 2 and the signal amplifier 3, the signal source 2 being an external reproduction device such as a Mini Disc (MD) player or a tuner.

This distortion correction circuit 31 has a reference voltage amplifier 32, an error amplifier 33 being a differential amplifier for error voltage detection, and a subtraction amplifier 34 being a differential amplifier for error voltage subtraction. The reference voltage amplifier 32 is previously set so as to have the same open-loop voltage gain as the signal amplifier 3. The error amplifier 33 has two inputs: one is connected to an output of the reference voltage amplifier 32; and the other is connected to an output of the signal amplifier 3.

The subtraction amplifier 34 has two inputs: one is connected to the signal source 2; and the other is connected to the output of the error amplifier 33. Between the one output of the subtraction amplifier 34 and the signal source 2, the input of the reference voltage amplifier 32 is connected.

In actual, in this distortion correction circuit, the error amplifier 33 detects a difference between the voltage of the audio signal S2 coming from the signal source 2 and subjected to the amplification of the signal amplifier 3 and the voltage of the audio signal S3 coming from the signal source 2 and subjected to the amplification of the reference amplifier 32, and supplies the resultant differential signal S4 to the other input of the subtraction amplifier 34.

Figure 4A:
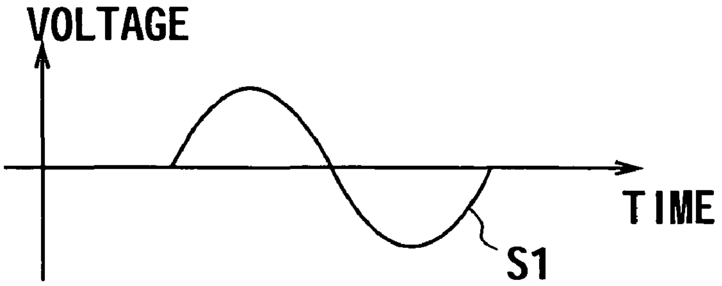
FIGS. 4A to 4E are signal wave diagrams explaining how voltage distortion is eliminated from an audio signal.
Figure 4B:
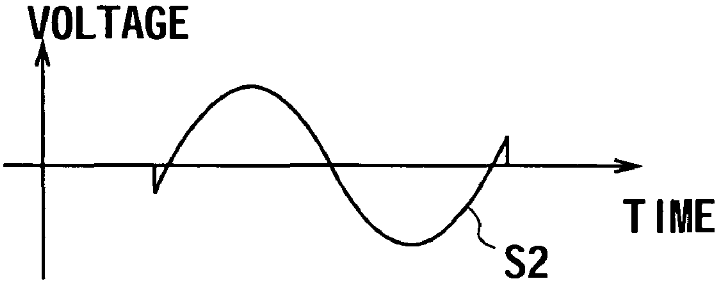

When the speaker 4 receives the audio signal S2 subjected to the amplification of the signal amplifier 3, a back electromotive force is generated from a voice coil 15 due to vibration of a cone diaphragm (not shown), and thereby current according to the back electromotive force flows into the signal amplifier 3. Therefore, when the signal amplifier 3 amplifies the audio signal S1 (FIG. 4A) coming from the signal source 2, distortion occurs in the voltage of the resultant audio signal S2 due to the back electromotive force (FIG. 4B).

Figure 4C:
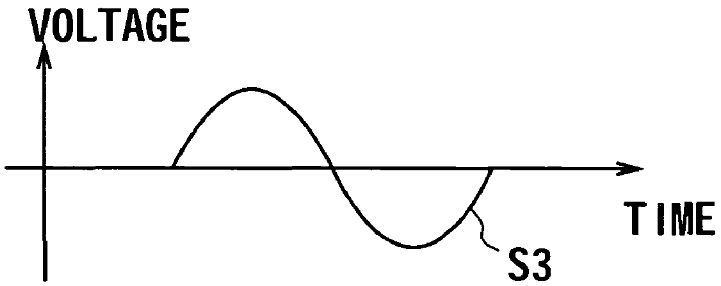
Figure 4D:
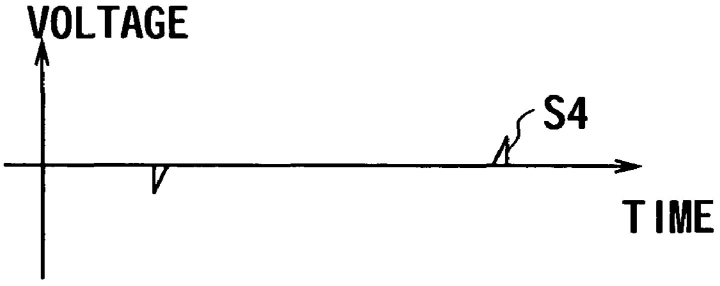

Since the signal amplifier 3 and the reference voltage amplifier 32 have the same open-loop voltage gain, the voltage of the differential signal S4 output from the error amplifier 33 is an error voltage (FIG. 4D) representing the distortion caused due to the back electromotive force generated from the voice coil 15, the differential signal S4 being a difference between the voltage (FIG. 4B) of the audio signal S2 obtained via the signal amplifier 3 and the voltage (FIG. 4C) of the audio signal S3 obtained via the reference voltage amplifier 32.

Figure 4E:
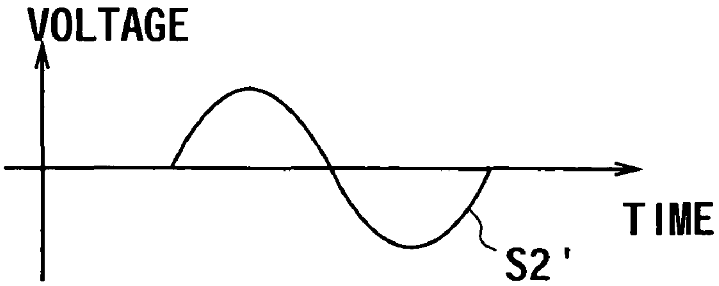

Subsequently, the subtraction amplifier 34 supplies a differential voltage to the input of the signal amplifier 3, the differential voltage obtained by subtracting the error voltage supplied from the error amplifier 33 from the voltage of the audio signal S1 supplied from the signal source 2. That is, the subtraction amplifier 34 eliminates the distortion (FIG. 4D) caused due to the back electromotive force generated from the voice coil 15 of the speaker 4, from the voltage of the audio signal S2. This means that, when the signal amplifier 3 amplifies an audio signal coming from the signal source 2, it supplies the voltage (FIG. 4E) of the audio signal S2' with the distortion corrected to the voice coil 15.

As described above, in the speaker unit 30, the signal amplifier 3 amplifies the audio signal S2 coming from the signal source 2, and then the distortion correction circuit 31 corrects the distortion caused in the output voltage of the signal amplifier 3 with the feedback control, and the speaker 4 outputs sounds based on the audio signal S2'.

(2) Operation and Effects According to this Embodiment

With the configuration described above, in this speaker unit 30, when the speaker 4 receives an audio signal S2 coming from the signal source 2 and subjected to the amplification of the signal amplifier 3, a back electromotive force is generated from the voice coil 15 due to vibration of the cone diaphragm in the speaker, with the result that current according to the back electromotive force flows into the signal amplifier 3.

At this time, the distortion correction circuit 31 detects an error voltage representing distortion caused due to the back electromotive force generated from the voice coil 15, from the voltage of the audio signal S2 output from the signal amplifier 3, subtracts the error voltage from the voltage of the audio signal S1, and supplies the obtained audio signal to the signal amplifier 3.

As a result, since the voltage of the audio signal S2' subjected to the amplification of the signal amplifier 3 has been corrected for the distortion caused due to the back electromotive force generated from the voice coil 15 with the feedback control, the audio signal S2' can be previously prevented from having distortion without influences of the back electromotive force generated from the voice coil 15 even when the audio signal S2' is given to the speaker 4.

As described above, the speaker unit 30 is provided with the distortion correction circuit 31 at the former stage of the signal amplifier 3. This distortion correction circuit 31 detects an error voltage representing distortion caused due to a back electromotive force generated from the voice coil 15 of the speaker 4, based on the audio signal S2 coming from the signal source 2 and subjected to the amplification of the signal amplifier 3, and subtracts the error voltage from the voltage of the original audio signal S1. As a result, sounds based on the audio signal S2' subjected to the amplification of the signal amplifier 3 do not have influences from the back electromotive force generated by the voice coil 15 and can be effectively prevented from having noise.

(3) Other Embodiments

The embodiment described above has described a case of applying this invention to the speaker unit 30 shown in FIG. 3. This invention, however, is not limited to this and can be widely applied to speaker units having speakers other than cone speakers, provided that the speaker units output sounds based on amplified audio signals.

Further, the embodiment described above has described a case where the speaker driving device has the signal amplifier 3 and the distortion correction circuit 31 shown in FIG. 3, the speaker driving device drives the speaker 4 by amplifying the input audio signal S1 with the signal amplifier (first amplification circuit) 3 and then supplying the voltage of the obtained audio signal S2 to the speaker 4. This invention, however, is not limited to this and can be widely applied to various kinds of speaker driving devices, provided that they can amplify the audio signal S1 and drive the speaker.

Still further, the embodiment described above has described a case where the reference voltage amplifier 32 and the error amplifier 33 in the distortion correction circuit 31 of the speaker unit 30 shown in FIG. 3 are used as a distortion detector for detecting distortion caused in the voltage of the audio signal S2 due to the back electromotive force generated from the voice coil (loads) 15 of the speaker 4. This invention, however, is not limited to this and the distortion detector has other kinds of configuration.

For example, the distortion detector of this embodiment has the reference voltage amplifier (second amplification circuit) 32 which has the same voltage gain as the signal amplifier (first amplification circuit) 3 and amplifies the input audio signal Si, and the error amplifier (comparison circuit) 33 for comparing the voltage of the audio signal S2 output from the signal amplifier (first amplification circuit) 3 with the output voltage of the reference voltage amplifier (second amplification circuit) 32 which is used as a reference.

As described above, the distortion correction circuit 31 has the reference voltage amplifier (second amplification circuit) 32 having the same voltage gain as the signal amplifier (first amplification circuit) 3, and the audio signal Si is input to both of the signal amplifier (first amplification circuit) 3 and the reference voltage amplifier (second amplification circuit) 32 and then the outputs of them are compared by the error amplifier (comparison circuit) 33. With this technique, a circuit configuration can be simplified, as compared with a case of differently providing a circuit for newly creating a signal having the same voltage as the audio signal S2 output from the signal amplifier (first amplification circuit) 3.

Still further, this embodiment has described a case where the subtraction amplifier 34 in the distortion correction circuit 31 of the speaker unit 30 shown in FIG. 3 is used as a distortion eliminator for eliminating a voltage for a distortion detected by the reference voltage amplifier 32 and the error amplifier 33 (error detector), from the voltage of the audio signal S2. This invention, however, is not limited to this and other kinds of distortion eliminators can be used.

Figure 5:
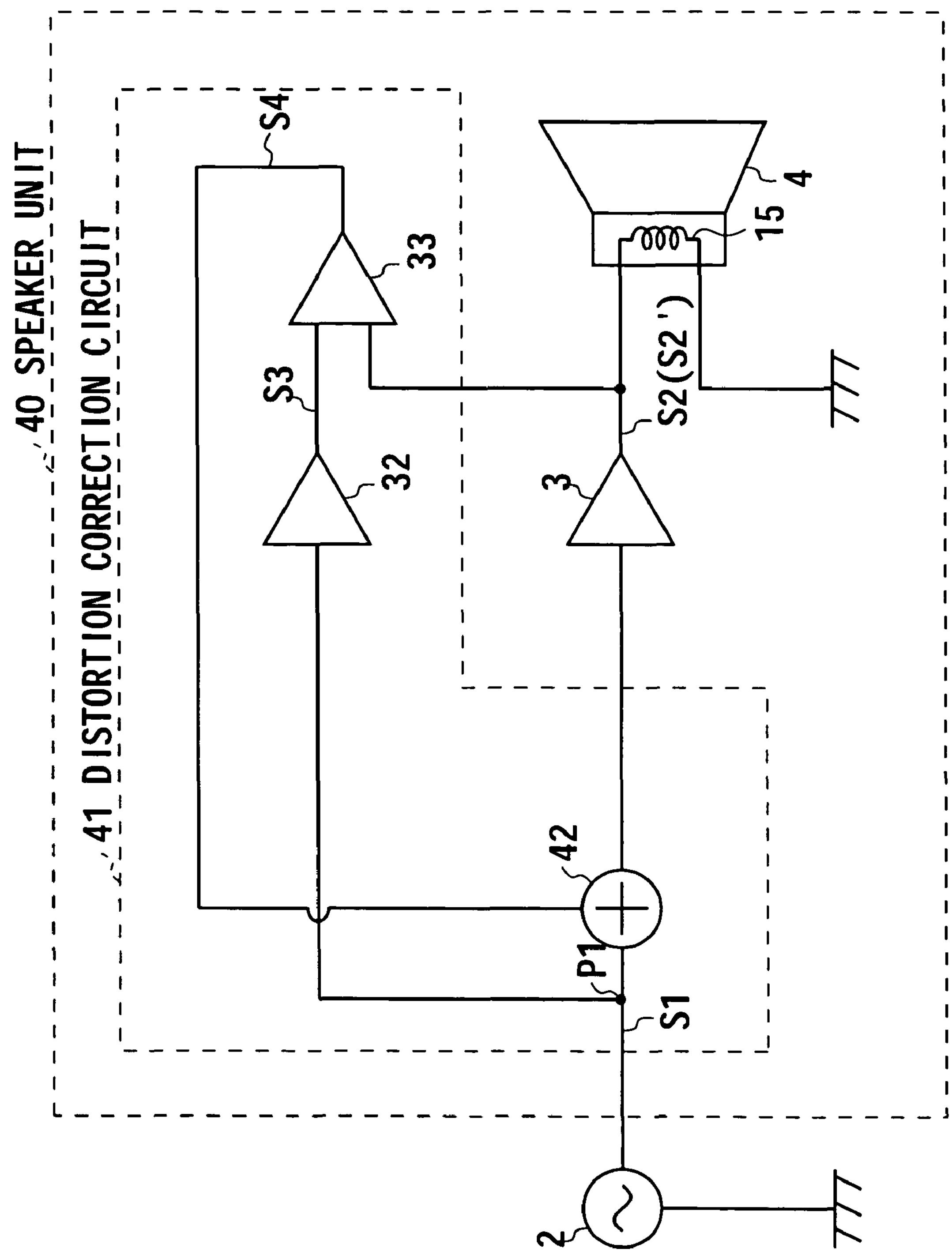
FIG. 5 is a block diagram of a speaker unit according to another embodiment.

For example, a speaker 30 shown in FIG. 5 where the same reference numerals are applied to parts corresponding to those of FIG. 3 is identical to the speaker unit 30 shown in FIG. 3, expect that a subtractor 42 is provided in an error correction circuit 41 instead of the subtraction amplifier 34 in the distortion correction circuit 31.

This distortion correction circuit 41 may be designed so that the subtractor 42 eliminates distortion caused due to a back electromotive force generated from a voice coil 15 of a speaker 4, from the voltage of an audio signal S2 by subtracting an error voltage (differential signal S4) given from an error amplifier 33 from the voltage of an audio signal S1 coming from a signal source 2.

It should be understood by those skilled in the art that various modifications, combinations, sub-combinations and alterations may occur depending on design requirements and other factors insofar as they are within the scope of the appended claims or the equivalents thereof.

What is claimed is:

1. A device for driving a speaker, comprising:

a distortion detector configured to detect distortion caused in the voltage of an audio signal at the input to the speaker due to a back electromotive force generated by loads in the speaker and output; and a subtraction amplifier, an input of which is electrically coupled to an output of the distortion detector, configured to eliminate a distorted voltage detected by the distortion detector, from the voltage of the audio signal, wherein a signal output from the subtraction amplifier is amplified by a first amplification circuit and supplied to the speaker, wherein the distortion detector includes:

a second amplification circuit having a same voltage gain as the first amplification circuit and operable to amplify the input audio signal; and a comparison circuit for comparing the voltage of the audio signal received from the first amplification circuit with an output voltage of the second amplification circuit to be used as a reference.

2. A method for driving a speaker, comprising:

detecting distortion caused in a voltage of an amplified audio signal supplied to a speaker due to a back electromotive force generated by loads of the speaker;

substantially eliminating, by a subtraction amplifier having an input that is electrically coupled to an output of the distortion detector, the detected distorted voltage from a voltage of the input audio signal; and amplifying and supplying a substantially distortion free audio signal to the speaker;

wherein detecting distortion caused in the voltage of the amplified audio signal comprises:

amplifying the input audio signal using a same voltage gain as that used to amplify the substantially distortion free audio signal supplied to the speaker; and comparing the voltage of the amplified audio signal supplied to the speaker with the amplified input audio signal.

3. The method according to claim 2, wherein detecting distortion caused in the voltage of the amplified audio signal further comprises comparing the voltage of the audio signal having the distortion caused by the back electromotive force generated by the loads of the speaker, with a reference a voltage of a signal obtained by amplifying the audio signal at a same voltage gain as the voltage gain applied to the input audio signal.

* * * * *